(12) United States Patent
Trabbic et al.

(10) Patent No.: US 7,253,625 B2
(45) Date of Patent: Aug. 7, 2007

(54) PRECISION GRADIENT AMPLIFIER WITH MULTIPLE OUTPUT VOLTAGE LEVELS

(75) Inventors: Daniel T. Trabbic, Burton, OH (US); Thomas R. McBride, Newbury, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 113 days.

(21) Appl. No.: 10/544,355

(22) PCT Filed: Jan. 22, 2004

(86) PCT No.: PCT/IB2004/000180

§ 371 (c)(1),
(2), (4) Date: Aug. 3, 2005

(87) PCT Pub. No.: WO2004/070411

PCT Pub. Date: Aug. 19, 2004

(65) Prior Publication Data

US 2006/0152222 A1    Jul. 13, 2006

Related U.S. Application Data

(60) Provisional application No. 60/444,558, filed on Feb. 3, 2004.

(51) Int. Cl.
*G01V 3/00* (2006.01)
(52) U.S. Cl. .................................. 324/322; 324/319
(58) Field of Classification Search ........ 324/300–322; 330/251, 207, 10; 337/124; 363/132; 327/588, 327/423, 108
See application file for complete search history.

(56) References Cited

U.S. PATENT DOCUMENTS

| | | | | |
|---|---|---|---|---|
| 3,715,649 A | * | 2/1973 | Ravas | ..................... 363/42 |
| 6,111,458 A | | 8/2000 | Ideler | .......................... 327/588 |
| 6,166,602 A | * | 12/2000 | Steigerwald et al. | ........ 330/251 |
| 6,172,558 B1 | * | 1/2001 | Nowak et al. | ................ 330/10 |
| 6,323,649 B1 | * | 11/2001 | Pace et al. | ................... 324/322 |
| 6,683,494 B2 | * | 1/2004 | Stanley | ........................ 330/10 |
| 7,068,097 B2 | * | 6/2006 | Atmur | .......................... 330/10 |
| 7,116,166 B2 | * | 10/2006 | Sabate et al. | ............... 330/146 |
| 2006/0145691 A1 | * | 7/2006 | Massengill et al. | ..... 324/207.25 |

FOREIGN PATENT DOCUMENTS

| | | | |
|---|---|---|---|
| DE | 198 12 069 A1 | * | 9/1999 |
| DE | 19812069 | | 9/1999 |
| JP | 9047445 | | 2/1997 |

OTHER PUBLICATIONS

Steigerwald, et al. "High-Power, High-Performance Switching Amplifier For Driving Magnetic Resonance Imaging Gradient Coils".
Schmitt, "Gradient Systems", pp. 477-486.

* cited by examiner

*Primary Examiner*—Brij B. Shrivastav

(57) ABSTRACT

A controlled power supply ($20_1$, $22_2$) drives a magnetic field gradient coil ($16_1$) of a magnetic resonance imaging apparatus (10). A gradient amplifier ($20_1$) includes a plurality of switching power regulators (50, 52, 54, 56) which are electrically connected in series. A bipolar circuit (70) receives power from the series connected switching power regulators (50, 52, 54, 56) and delivers the power at a selected polarity to the gradient coil ($16_1$). A control circuit ($22_1$) delivers phase staggered pulse width modulated control signals (A, B, C, D) to the switching power regulators (50, 52, 54, 56).

22 Claims, 7 Drawing Sheets

PRECISION GRADIENT AMPLIFIER WITH MULTIPLE OUTPUT VOLTAGE LEVELS

CROSS REFERENCE TO RELATED APPLICATIONS

This application claims the benefit of U.S. provisional application Ser. No. 60/444,558 filed Feb. 3, 2004, which is incorporated herein by reference.

The following relates to the diagnostic imaging arts. It particularly relates to controlled power supplies for driving magnetic field gradient coils of magnetic resonance imaging scanners, and will be described with particular reference thereto. However, the following relates more generally to precision controlled power supplies for various applications.

In a magnetic resonance imaging system, spatial encoding is typically performed by generating magnetic field gradients in the main magnet bore. These gradients are produced by a set of magnetic field gradient coils. Gradient coils are typically provided for producing independent magnetic field gradients in each of the x-, y-, and z-directions.

Magnetic resonance imaging techniques such as echo planar imaging employ high field strength, high frequency magnetic field gradient waveforms. Moreover, the gradient slew rate, waveform shape, amplitude, and other parameters of the magnetic field gradients vary widely for different types of imaging sequences. Hence, magnetic field gradient coil power supplies should deliver arbitrary power waveforms at high voltages (e.g. peak voltages of 100 volts or higher), high currents (e.g. hundreds of amperes) and high frequencies (e.g., hundreds of cycles per second) and slew rates. Furthermore, the power supply should be able to source or sink current at bipolar voltages (4-quadrant operation).

Pulse-width modulated switching amplifiers are commonly used in magnetic field gradient power supplies. A pulse-width modulated control signal triggered by a carrier signal oscillating at about 40 kHz switches the switching power supply at the carrier signal frequency to deliver pulse-width modulated power to the gradient coil. Power oscillations at the carrier frequency are removed by low-pass filtering inherent in the gradient coil. Both half-bridge and full-bridge pulse-width modulated amplifiers have been employed.

These amplifiers include component transistors which meet stringent voltage, current, and speed (frequency) specifications. For example, the transistors should have both a maximum voltage rating exceeding the maximum voltage applied to the gradient coil, and a maximum frequency rating exceeding the carrier frequency.

Another disadvantage of such switching amplifiers is that they switch between full-voltage (positive or negative) and zero voltage regardless of the amount of power being delivered, since power is controlled by the pulse duty cycle rather than by amplitude. High frequency switching between full-voltage and zero voltage introduces harmonic distortions, large ripple currents, substantial heating within the gradient coil, and radio frequency interference that can degrade performance of other components of the magnetic resonance imaging system.

The present invention contemplates an improved apparatus and method that overcomes the aforementioned limitations and others.

According to one aspect, a controlled power supply is disclosed for driving a magnetic field gradient coil of a magnetic resonance imaging apparatus. A plurality of switching power regulators are electrically connected in series to deliver power to the gradient coil. A control circuit delivers phase-staggered pulse-width modulated control signals to the switching power regulators.

According to another aspect, a method is provided for applying controlled power to a magnetic field gradient coil of a magnetic resonance imaging apparatus. Phase-staggered pulse-width modulated control signals are generated. A plurality of switched power outputs are produced. Each switch power output is switched by one of the phase-staggered pulse-width modulated control signals. The switched power outputs are combined in series. The series-combined switched power outputs are applied to the gradient coil.

According to yet another aspect, an apparatus is disclosed for applying controlled power to a magnetic field gradient coil of a magnetic resonance imaging apparatus. A means is provided for generating phase-staggered pulse-width modulated control signals. A means is provided for producing a plurality of switched power outputs each of which is switched by one of the phase-staggered pulse-width modulated control signals. A means is provided for combining the switched power outputs in series. A means is provided for applying the series-combined switched power outputs to the gradient coil.

One advantage resides in reduced voltage loads on high-speed transistors of the power amplifier.

Another advantage resides obtaining a higher frequency power output without a corresponding increase in switching frequency.

Yet another advantage resides in reduced harmonic distortion and ripple currents.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 2:
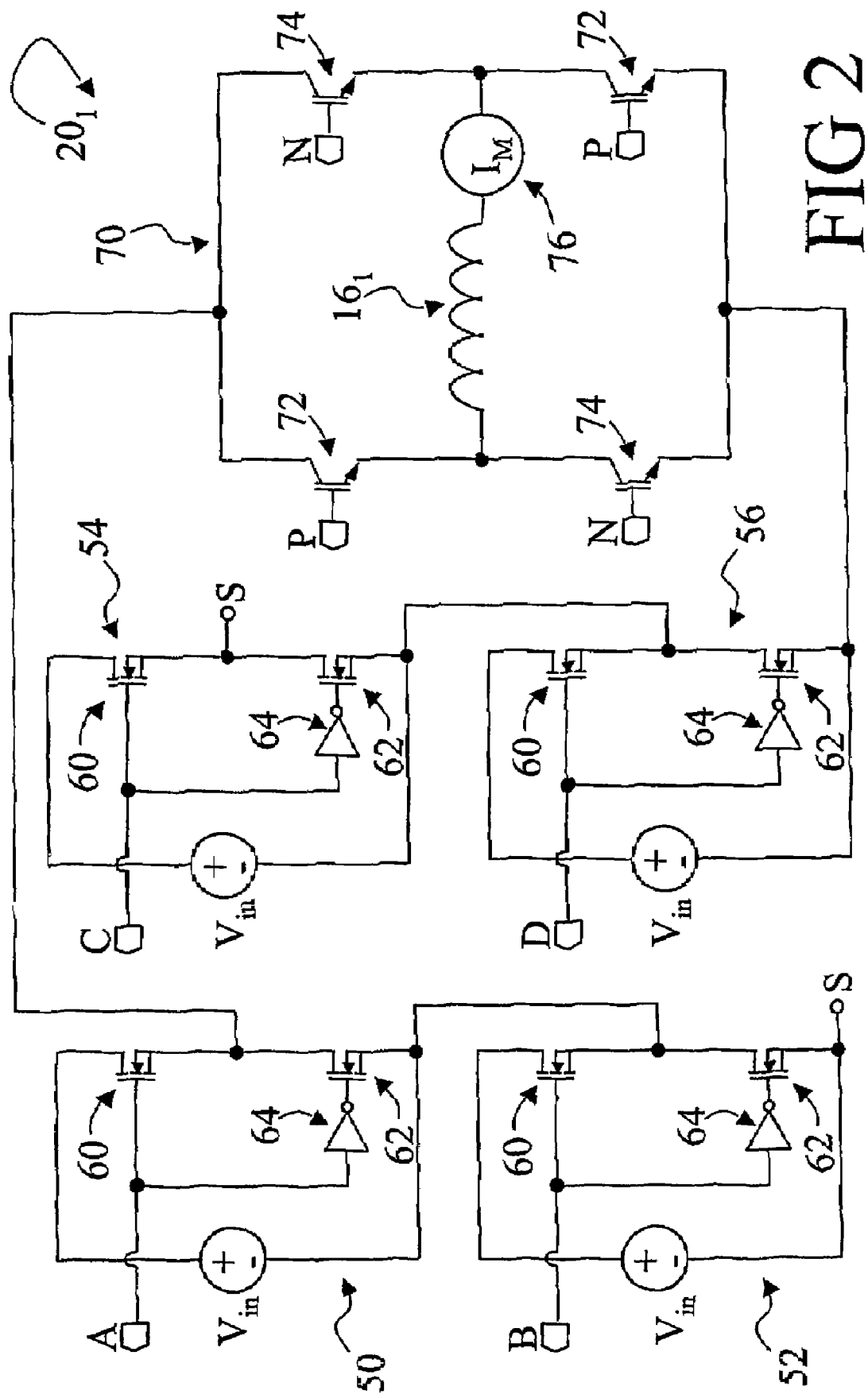
FIG. 2 shows an electrical circuit of one of the magnetic field gradient amplifiers of the imaging apparatus of FIG. 1.
Figure 3:
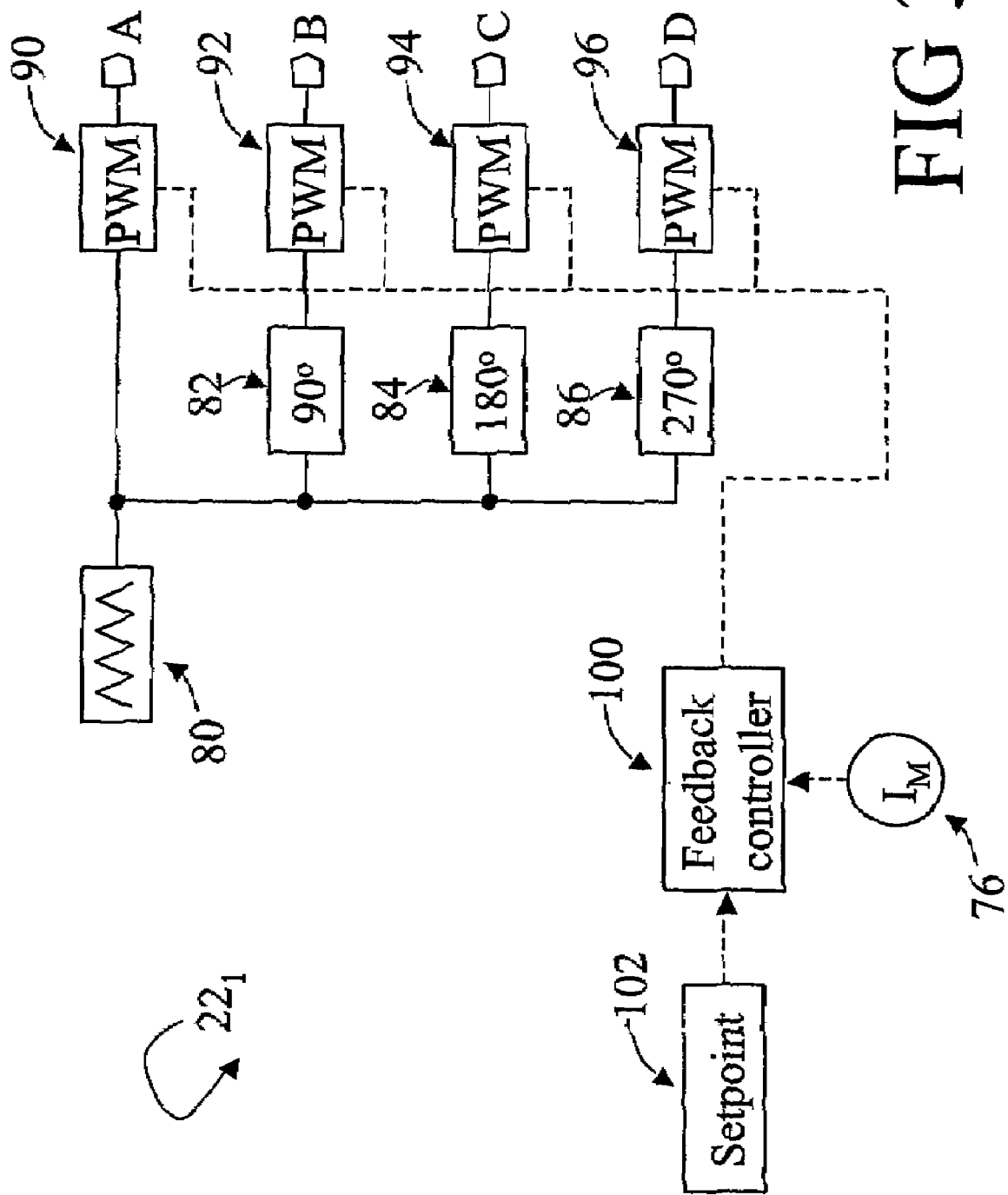
FIG. 3 shows an electrical circuit of one of the magnetic field gradient controllers of the imaging apparatus of FIG. 1.
Figure 4:
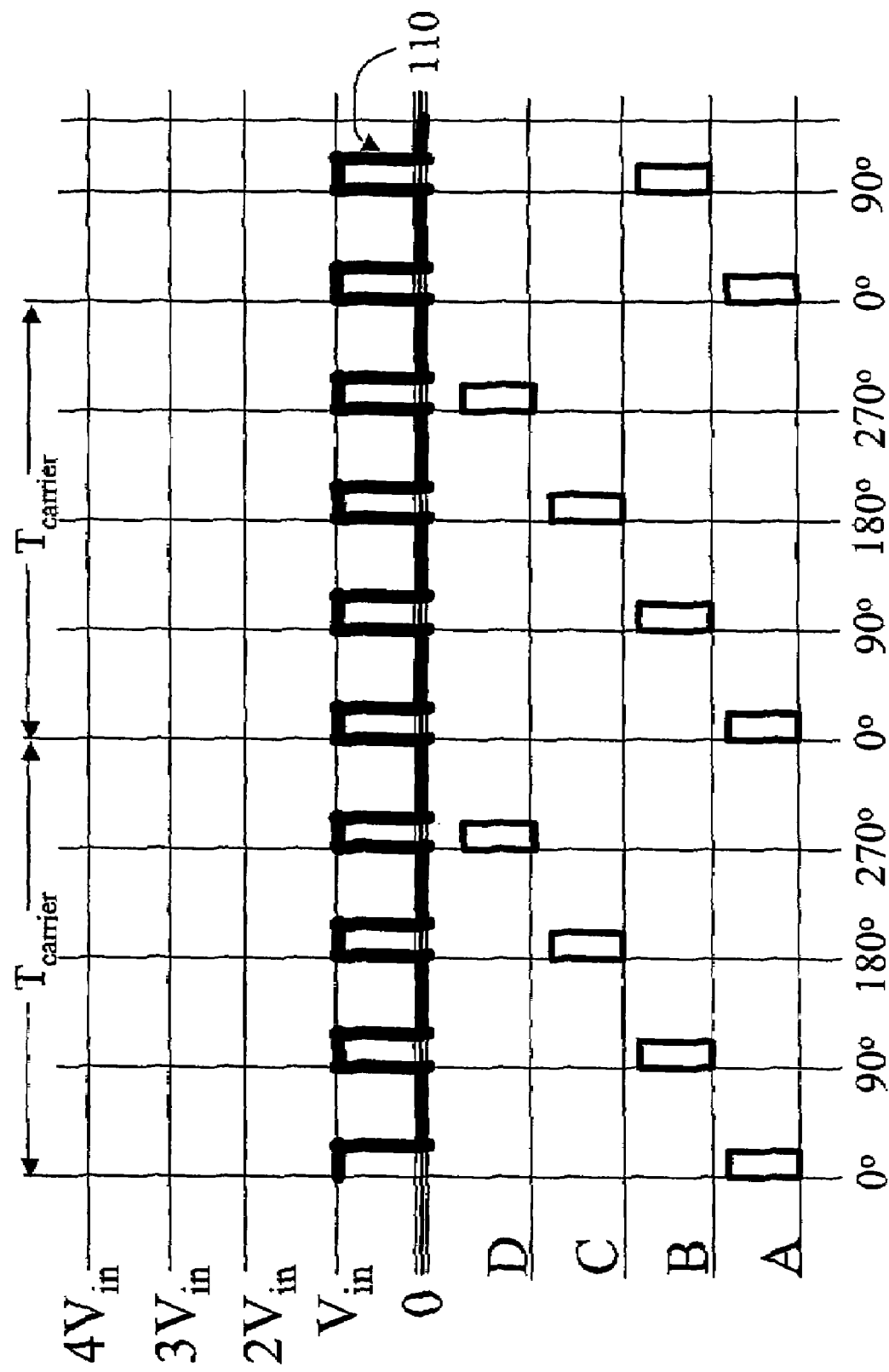

FIG. 4 diagrammatically shows low output voltage switching operation of the magnetic field gradient power supply of FIGS. 2 and 3.

Figure 5:
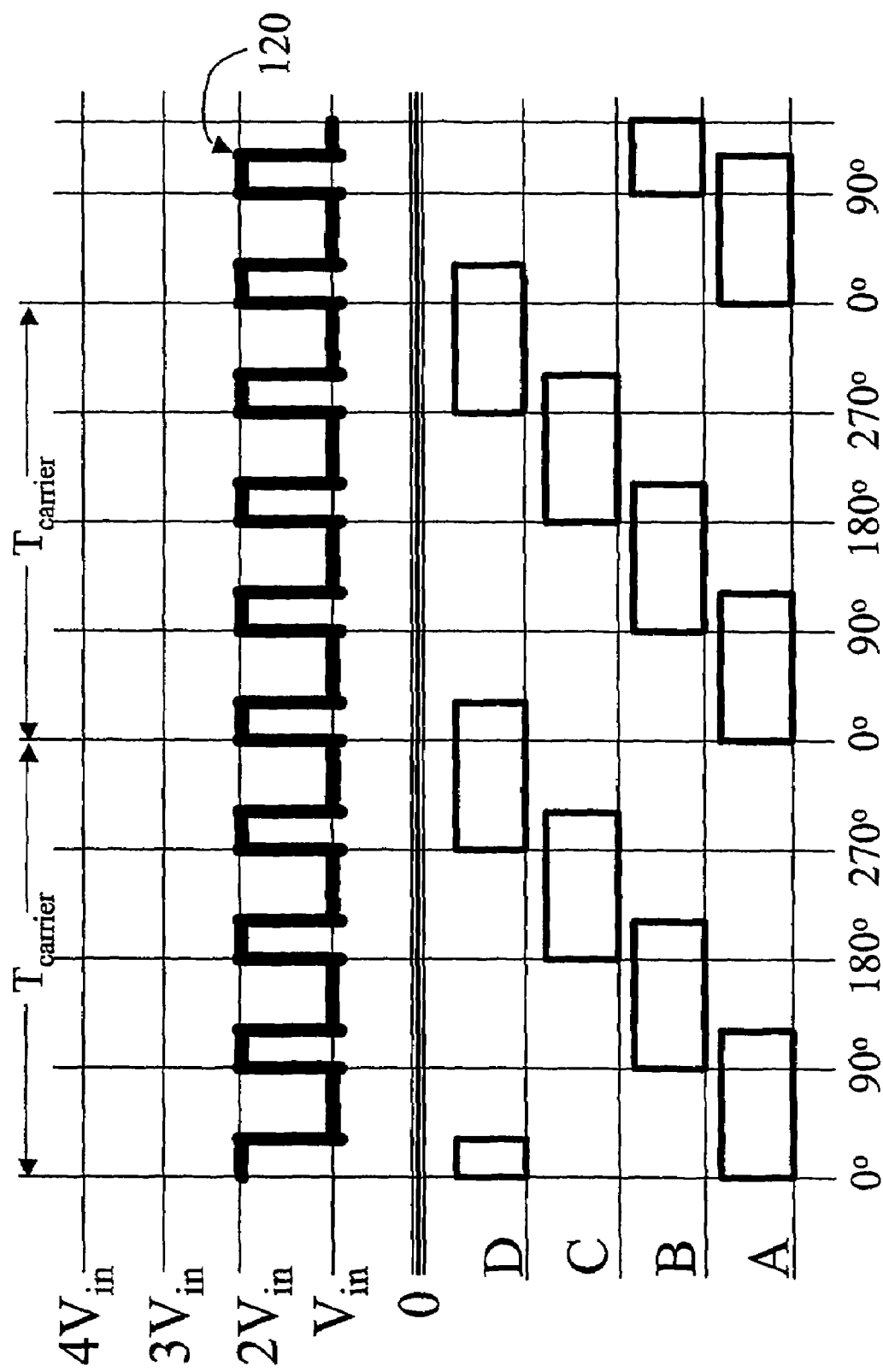

FIG. 5 diagrammatically shows intermediate output voltage switching operation of the magnetic field gradient power supply of FIGS. 2 and 3.

Figure 6:
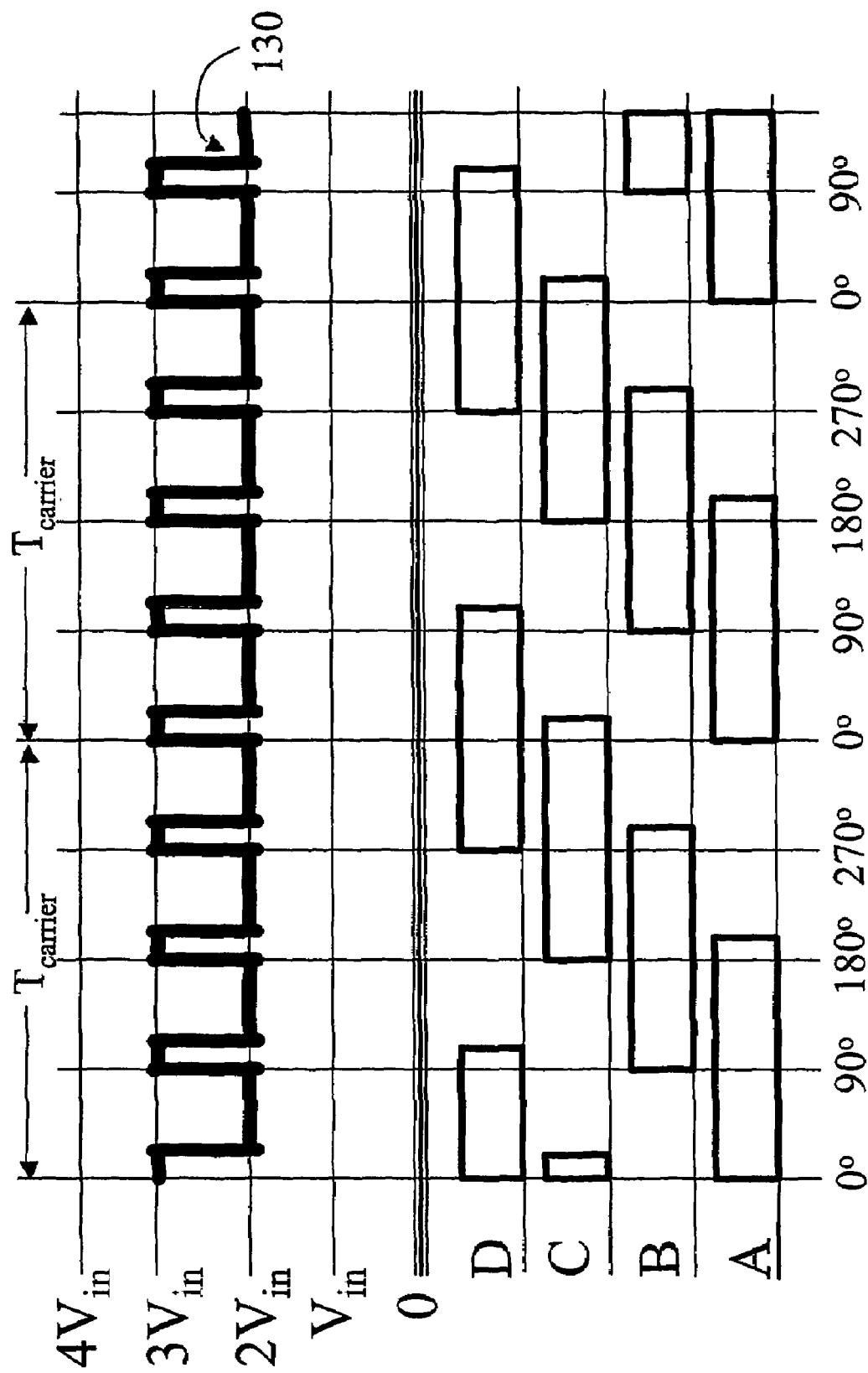

FIG. 6 diagrammatically shows intermediate output voltage switching operation of the magnetic field gradient power supply of FIGS. 2 and 3, in which the output voltage is higher than the output voltage in FIG. 5.

Figure 7:
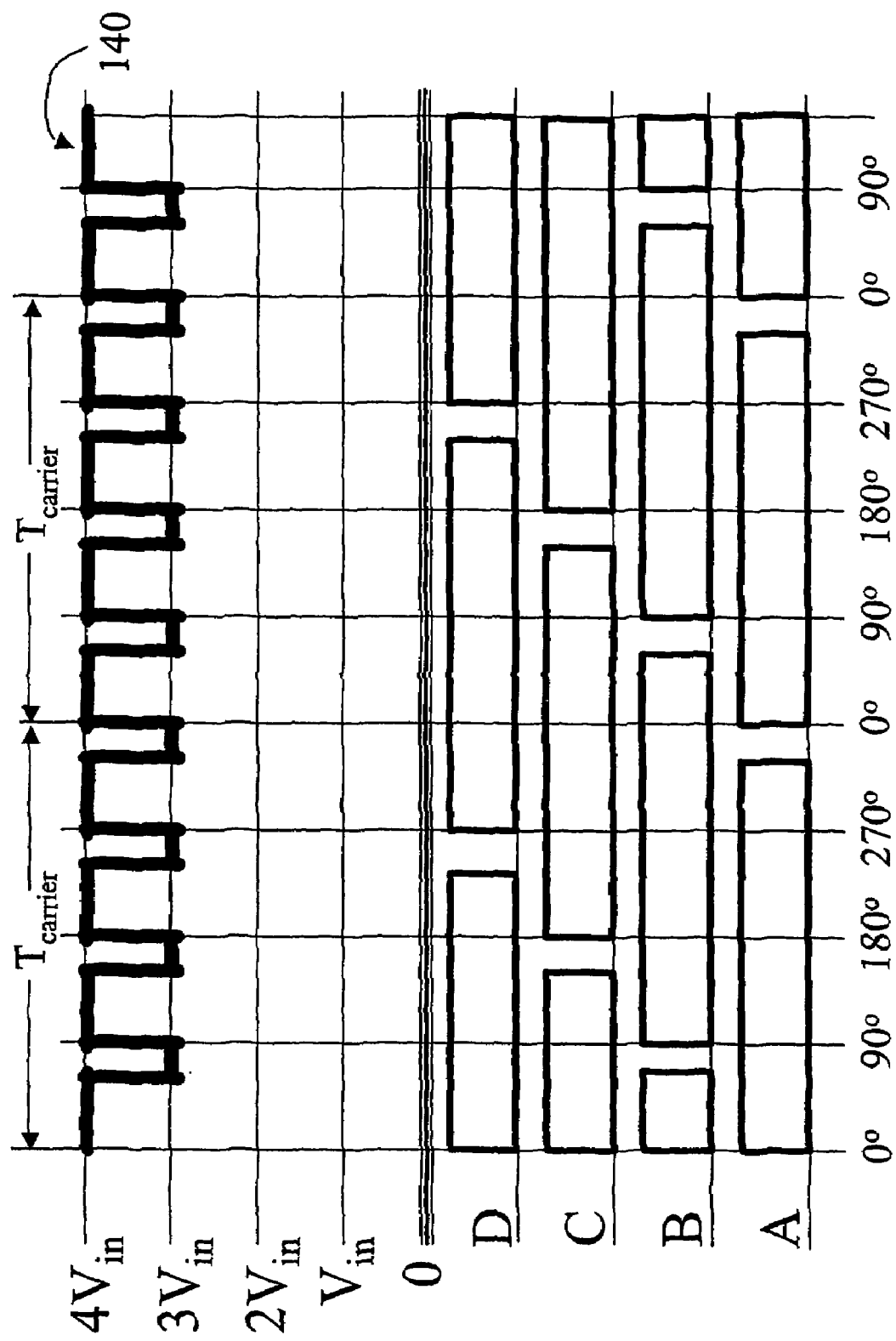

FIG. 7 diagrammatically shows high output voltage is switching operation of the magnetic field gradient power supply of FIGS. 2 and 3.

Figure 1:
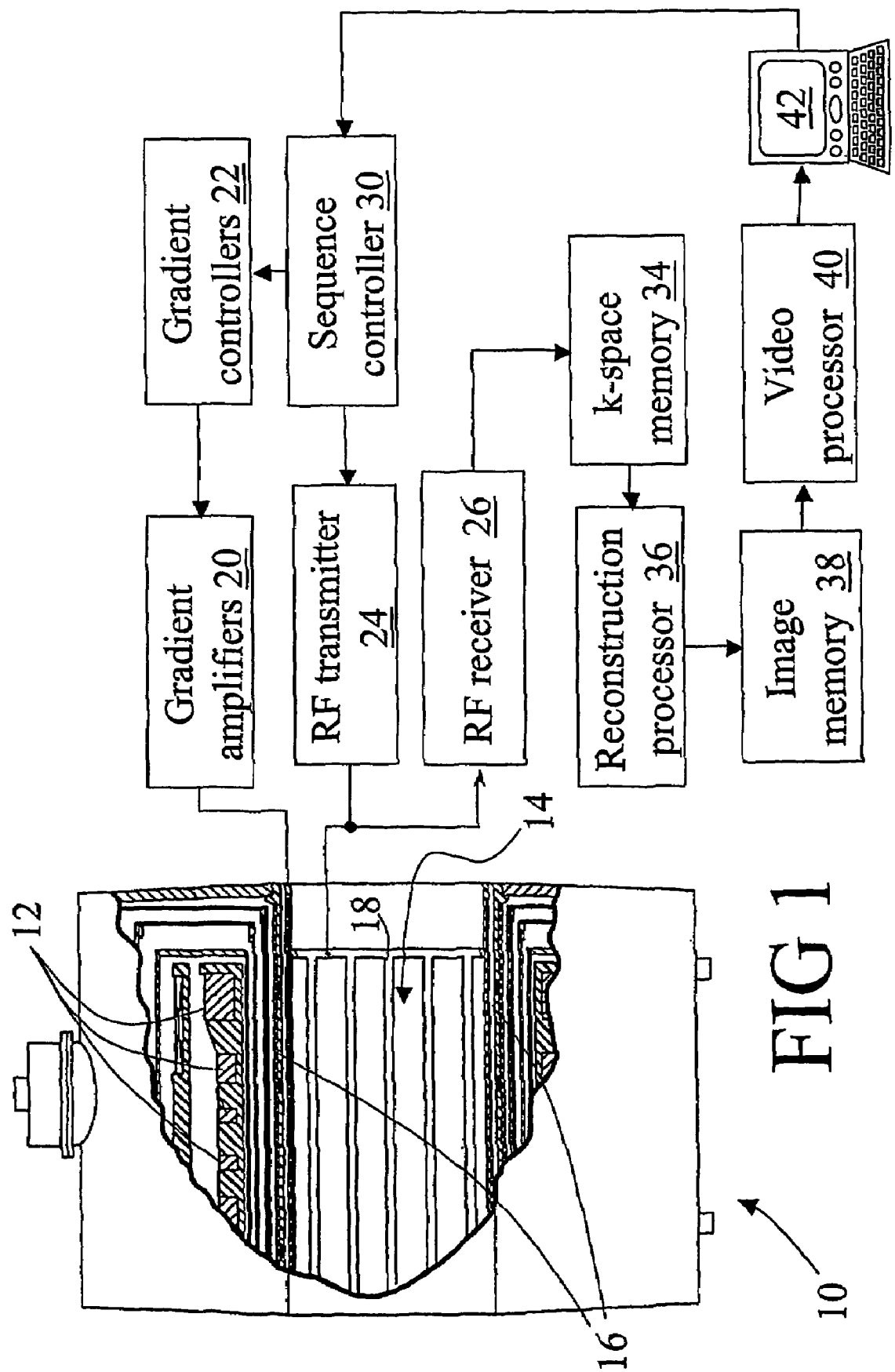
FIG. 1 shows a magnetic resonance imaging apparatus that employs multi-stage magnetic field gradient amplifiers.

With reference to FIG. 1, a magnetic resonance imaging scanner 10 includes a cylindrical main magnet 12, which is preferably superconducting and cryoshrouded. The main magnet 12 defines a magnet bore 14 inside of which a patient or other imaging subject is placed for imaging. The main magnet 12 produces a spatially and temporally constant and uniform main magnetic field oriented along a longitudinal axis of the bore 14. Instead of a superconducting magnet, a non-superconducting magnet can be used. Moreover, a vertical magnet, an open magnet, or other type of main magnet can be employed instead of the illustrated horizontal cylindrical main magnet 12.

Magnetic field gradient coils 16 produce magnetic field gradients in the bore 14 for spatially encoding magnetic resonance signals, for producing magnetization-spoiling field gradients, or the like. Preferably, the magnetic field gradient coils 16 include coils configured to produce magnetic field gradients in three orthogonal directions including the longitudinal axial direction parallel to the main magnetic field.

A whole body radio frequency coil assembly 18 generates radio frequency pulses for exciting magnetic resonances. The radio frequency coil assembly 18 also serves to detect magnetic resonance signals. Optionally, additional local radio frequency coils or phased radio frequency coil arrays (not shown) are included for exciting and/or detecting magnetic resonances at localized areas in the bore 14.

Gradient pulse amplifiers 20 deliver controlled electrical currents to the magnetic field gradient coils 16 to produce selected magnetic field gradients. Magnetic field gradient controllers 22 control the gradient pulse amplifiers 20. Each of the gradient coils of the three orthogonal directions (that is, pairs of coils that cooperatively produce transverse x- and y-directional gradients, and a gradient coil that produces longitudinal z-directional gradients) preferably has a corresponding gradient pulse amplifier 20 and magnetic field gradient controller 22 so that independent magnetic field gradients can be produced in the x-, y-, and z-directions.

A radio frequency transmitter 24, preferably digital, applies radio frequency pulses or pulse packets to the radio frequency coil assembly 18 to generate selected magnetic resonance excitations. A radio frequency receiver 26 also coupled to the radio frequency coil assembly 18 receives magnetic resonance signals. If more than one radio frequency coil is provided (such as a local coil or phased coil array), then different coils are optionally used for the magnetic resonance excitation and detection operations.

To acquire magnetic resonance imaging data of a subject, the subject is placed inside the magnet bore 14, preferably at or near an isocenter of the main magnetic field. A sequence controller 30 communicates with the gradient controllers 22 and the radio frequency transmitter 24 to produce selected transient or steady state magnetic resonance configurations in the subject, to spatially encode such magnetic resonances, to selectively spoil magnetic resonances, or otherwise generate selected magnetic resonance signals characteristic of the subject. The generated magnetic resonance signals are detected by the radio frequency receiver 26, and stored in a k-space memory 34. The imaging data is reconstructed by a reconstruction processor 36 to produce an image representation that is stored in an image memory 38. In one suitable embodiment the reconstruction processor 36 performs an inverse Fourier transform reconstruction.

The resultant image representation is processed by a video processor 40 and displayed on a user interface 42, which is preferably a personal computer, workstation, or other type of computer. Rather than producing a video image, the image representation can be processed by a printer driver and printed, transmitted over a computer network or the Internet, or the like. Preferably, the user interface 42 also allows a radiologist or other operator to communicate with the magnetic resonance sequence controller 30 to select magnetic resonance imaging sequences, modify imaging sequences, execute imaging sequences, and so forth.

With reference to FIG. 2, an individual gradient pulse amplifier $20_1$ controls a gradient coil $16_1$. The gradient coil $16_1$ is one of the gradient coils 16 of FIG. 1, while the gradient pulse amplifier $20_1$ is one of the gradient pulse amplifiers 20 of FIG. 1. The gradient coil $16_1$ is typically one of a pair of gradient coils that produce selected magnetic field gradients in the x-direction, the y-direction, or the longitudinal z-direction.

The gradient pulse amplifier $20_1$ includes four switching power regulators 50, 52, 54, 56, which receive phase-staggered pulse-width modulated control signals A, B, C, D, respectively. In the illustrated embodiment, each switching power regulator 50, 52, 54, 56 is a half-bridge amplifier that regulates a voltage $V_{in}$. Each regulator 50, 52, 54, 56 includes two high-speed field effect transistors 60, 62. The gate of the transistor 60 receives the pulse-width modulated control signal A, B, C, D directly, while an inverter 64 is interposed between the pulse-width modulated control signal A, B, C, D and the gate of the transistor 62. Hence, the transistors 60, 62 act as a two-state switch.

In a high voltage state, the transistor 60 is conducting while the transistor 62 is non-conductive. This places the voltage $V_{in}$ over non-conducting transistor 62. In a low voltage state, the transistor 60 is non-conductive while the transistor 62 is conducting. The output is taken over the transistor 62. The outputs of the four switching power regulators 50, 52, 54, 56 are connected in series (note that the lower output terminal of power regulator 52 connects with the upper output terminal of power regulator 54, as indicated by the connection point S).

Hence, the series-connected power regulators 50, 52, 54, 56 collectively produce one of five voltage levels: 0V, $V_{in}$, $2V_{in}$, $3V_{in}$, or $4V_{in}$, depending upon the state of the pulse-width modulated control signals A, B, C, D. The series-connected power regulators 50, 52, 54, 56 collectively provide a voltage resolution of $V_{in}$, which is one-fourth of the voltage maximum output voltage $4V_{in}$.

A bipolar circuit 70 receives the output of the series-connected power regulators 50, 52, 54, 56. In the illustrated embodiment, the bipolar circuit 70 is a full-bridge amplifier that includes two pairs of insulated gate bipolar transistors 72, 74. The bipolar circuit 70 applies the output of the series-connected power regulators 50, 52, 54, 56 to the magnetic field gradient coil 16, at a selected polarity.

Specifically, inputs P, N applied to the transistors 72, 74, respectively, select the polarity. A first polarity is provided if the input P places the transistors 72 in a conducting state while the input N places the transistors 74 in a non-conducting state. A second polarity opposite the first polarity is provided if the input P places the transistors 72 in a non-conducting state while the input N places the transistors 74 in a conducting state. Preferably, an ammeter 76 measures electrical current flowing through the magnetic field gradient coil $16_1$.

In the amplifier $20_1$, polarity selection is provided by the bipolar circuit 70 which is separate from the power regulators 50, 52, 54, 56. As discussed later, this arrangement has certain advantages. However, it is also contemplated to integrate polarity selection with the power regulators 50, 52, 54, 56, for example by replacing the half-bridge power regulators 50, 52, 54, 56 with full-bridge power regulators.

With reference to FIG. 3, the pulse-width modulated control signals A, B, C, D are generated by a magnetic field gradient controller $22_1$. The magnetic field gradient controller $22_1$ is one of the gradient controllers 22 of FIG. 1, and is associated with the gradient pulse amplifier $20_1$ and gradient coil $16_1$ of FIG. 2.

An a.c. carrier signal 80 defines a frequency of the pulse-width modulated control signals A, B, C, D. In one suitable embodiment, the a.c. carrier signal 80 oscillates at 40 kHz. Phase shifting circuits 82, 84, 86 shift the phase of the a.c. carrier signal 80 by 90°, 180°, and 270°, respectively. The carrier signal 80 is input into a pulse width modulator 90, while the outputs of the phase shifting circuits 82, 84, 86 are input into pulse-width modulators 92, 94, 96. Each pulse-width modulator 90, 92, 94, 96 produces a pulse train with a frequency and phase defined by the input carrier signal. The pulse trains are the pulse-width modulated control signals A, B, C, D, and so the control signals A, B, C, D are phase-staggered at 90° intervals.

A feedback controller 100 compares a set point 102 with an output of the ammeter 76 that measures current in the gradient coil $16_1$. A control signal produced by the controller 100 based on the comparison is input to the pulse-width modulators 90, 92, 94, 96, and controls a pulse width of pulses of the control signals A, B, C, D. Typically, the set point 102 is provided by the sequence controller 30 (see FIG. 1) based on the desired magnetic field gradient called for in the imaging sequence. It will be appreciated that the set point 102 can dynamically vary, for example as the magnetic field gradient slews. Moreover, other feedback signals besides gradient coil current can be used for control, such as a gradient coil voltage or a measured characteristic of the magnetic field gradient produced by the gradient coil $16_1$.

With continuing reference to FIGS. 2-3, and with further reference to FIGS. 4-7, operation of the gradient controller $22_1$ and gradient amplifier $20_1$ is described. In a lower portion of each of FIGS. 4-7, the pulse-width modulated control signals A, B, C, D are shown. In an upper portion of each of FIGS. 4-7, the output voltage applied by the series-connected switching power regulators 50, 52, 54, 56 to the bipolar circuit 70 is plotted on a scale of 0 to $4V_{in}$. In each of FIGS. 4-7, a period $T_{carrier}$ of the a.c. carrier signal 80 is indicated. For a 40 kHz carrier frequency, $T_{carrier}$=0.025 ms. Each of FIGS. 4-7 further includes an abscissa indicating a phase of the a.c. carrier signal 80.

FIG. 4 shows operation in which the feedback controller 100 is generating a control signal corresponding to a short pulse width. Specifically, in FIG. 4 the duty cycle of pulse-width modulated control signals A, B, C, D is less than 25%. Since the phase staggering is 90° (i.e. 25% of the carrier period $T_{carrier}$) the pulses of the four control signals A, B, C, D do not temporally overlap. Hence, an output voltage 110 varies discretely between zero volts and $V_{in}$.

It will be noticed that the output voltage 110 has a period which is one-fourth of the carrier period $T_{carrier}$. Hence, the output voltage 110 has a frequency that is four times the carrier frequency. This is a consequence of the phase staggering. The high frequency components of the output voltage 110 are filtered out by intrinsic low-pass filtering of the magnetic field gradient coil $16_1$.

FIG. 5 shows operation in which the feedback controller 100 is generating a control signal corresponding to a pulse width of duty cycle between 25% and 50%. In this case, there are regions in which two of the pulse-width modulated control signals A, B, C, D are simultaneously on. That is, there are regions in which two pulses overlap in time. Moreover, at all times at least one of the control signals A, B, C, D is producing a pulse. As a consequence, an output voltage 120 varies discretely between $V_{in}$ and $2V_{in}$. As in FIG. 4, the frequency is four times the carrier frequency.

FIG. 6 shows operation in which the feedback controller 100 is generating a control signal corresponding to a pulse width of duty cycle between 50% and 75%. In this case, either two or three of the control signals A, B, C, D are simultaneously on at any given time. That is, either two or three pulses are overlapping at any given time. As a consequence, an output voltage 130 varies discretely between $2V_{in}$ and $3V_{in}$. As in FIGS. 4 and 5, the frequency is four times the carrier frequency.

FIG. 7 shows operation in which the feedback controller 100 is generating a control signal corresponding to a pulse width of duty cycle between 75% and 100%. In this case, either three or four of the control signals A, B, C, D are simultaneously on at any given time. That is, either three or four pulses are overlapping at any given time. As a consequence, an output voltage 140 varies discretely between $3V_{in}$ and $4V_{in}$. As in FIGS. 4-6, the frequency is four times the carrier frequency.

As demonstrated in FIGS. 5-7, one advantage of the gradient controller $22_1$ and gradient amplifier $20_1$ is that for higher desired output voltages (i.e. voltages that exceed one-fourth of the maximum voltage $4V_{in}$), the output voltage does not drop to zero volts. Similarly, as demonstrated in FIGS. 4-6, for lower voltages (i.e. voltages below three-fourths of the maximum voltage $4V_{in}$), the output voltage does not rise to the maximum voltage $4V_{in}$. Indeed, for any given voltage the instantaneous variation is only one-fourth of the maximum voltage, which provides improved instantaneous voltage resolution.

Another advantage of the gradient controller $22_1$ and gradient amplifier $20_1$ is that for a given switching frequency, that is, for a given carrier frequency, the output power switching frequency is four times the carrier frequency. This enables more precise tailoring of gradient slews without using higher-speed electronics.

In the gradient amplifier $20_1$, the high-speed field effect transistors 60, 62 never see more than a maximum voltage of $V_{in}$, which is one-fourth of a rated output voltage amplitude $V_{rated}$ which corresponds to $4V_{in}$. Hence, the switching voltage regulators 50, 52, 54, 56 can be constructed using high speed field effect transistors 60, 62 specified to have a reduced maximum operating voltage that exceeds $V_{in}$ but is well below $V_{rated}$.

In contrast, the insulated gate bipolar transistors 72, 74 of the bipolar circuit 70 do see the full voltage amplitude $V_{rated}$ applied to the gradient coil $16_1$. However, the transistors 72, 74 do not need to switch at high frequency. Hence, the transistors 72, 74 are preferably selected for high power operation with reduced speed specification. Specifically, the bipolar circuit 70 can be constructed using transistors 72, 74 specified to have a frequency rating which is substantially below the carrier frequency of the pulse-width modulated control signals A, B, C, D.

An additional advantage of using the separate bipolar circuit 70 rather than integrating polarity selection into the power regulators is reduced circuit complexity. For example, the illustrated half-bridge power regulators 50, 52, 54, 56 include fewer components than a similar circuit that incorporates polarity selection, such as a full-bridge regulator.

Although a gradient controller 22, and gradient amplifier $20_1$ with four switching voltage regulators 50, 52, 54, 56 is illustrated, those skilled in the art can readily add or subtract voltage regulator stages. For N switching voltage regulators, the phase staggering is preferably selected as 360°/N. The output power frequency is N times the carrier frequency. The voltage resolution is the rated voltage $V_{rated}$ divided by the number of voltage regulator stages N, that is voltage resolution is $V_{rated}/N$.

If the gradient amplifier $20_1$, is extended by including additional voltage regulators that each regulate input voltage $V_{in}$, then each additional voltage regulator increases the maximum voltage that can be applied over the gradient coil $16_1$. For example, six voltage regulators each regulating an input voltage $V_{in}$ can output a maximum voltage of $6V_{in}$ with a voltage resolution of $V_{in}$. Since the high speed field effect transistors 60, 62 each regulate a maximum voltage of $V_{in}$, adding more voltage regulators does not affect the choice of high speed transistors 60, 62. Indeed, only the four transistors 70, 72 of the amplifier $20_1$, which do not operate at high speeds, may need to be modified to accommodate a higher maximum voltage produced when more voltage regulator stages are added.

Alternatively, the rated voltage can be retained as regulator stages are added by lowering the voltage regulated by each voltage regulator. In this case, voltage resolution increases as regulator stages are added, and the high speed field effect transistors 60, 62 process lower maximum voltages.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A controlled power supply for driving a magnetic field gradient coil of a magnetic resonance imaging apparatus, the power supply including:
    a plurality of switching power regulators electrically connected in series to deliver power to the gradient coil; and
    a control circuit that delivers phase staggered pulse width modulated control signals to the switching power regulators, the control circuit including:
        phase shifting circuits that each introduce a different selected phase shift to an a.c. carrier signal to define phase staggered a.c. carrier signals,
        pulse width modulation circuits that each receive one of the phase staggered a.c. carrier signals and produce a pulse train at a frequency and phase selected by the received phase staggered a.c. carrier signal, and
        a feedback controller communicating with the pulse width modulation circuits to control a pulse width of pulses of the pulse trains based on a set point and a feedback signal from the magnetic field gradient coil.

2. The power supply as set forth in claim 1, wherein each switching power regulator includes:
    a half bridge amplifier empolying at least one high speed field effect transistor as a switching device.

3. The power supply as set forth in claim 1, wherein a total number of switching power regulators is N, and the switching power regulators each include:
    high speed field effect transistors having a voltage rating below $V_{rated}$ and exceeding $V_{rated}/N$ where $V_{rated}$ is a maximum voltage amplitude delivered to the gradient coil.

4. A controlled power supply for driving a magnetic field gradient coil of a magnetic resonance imaging apparatus, the power supply including:
    a plurality of switching power regulators electrically connected in series and configured to deliver power to the gradient coil wherein the switching power regulators each include high speed field effect transistors; and
    a control circuit configured to deliver phase staggered pulse width modulated control signals to the switching power regulators wherein the power supply having a total number of switching power regulators is N, and the switching power regulators each include high speed field effect transistors having a rating below $V_{rated}$ and exceeding $V_{rated}/$where $V_{rated}$ is a maximum voltage amplitude delivered to the gradient coil.

5. The power supply as set forth in claim 4, wherein the control circuit includes:
    phase shifting circuits that each introduce a different selected phase shift to an a.c. carrier signal to define phase staggered a.c. carrier signals; and
    pulse width modulation circuits that each receive one of the phase staggered a.c. carrier signals and produce a pulse train at a frequency and phase selected by the received phase staggered a.c. carrier signal.

6. The power supply as set forth in claim 4, wherein the control circuit includes:
    a controller that computes a pulse width of the pulse width modulated control signals, the computed pulse width controlling power delivered to the gradient coil.

7. The power supply as set forth in claim 4, wherein the plurality of switching power regulators include N switching power regulators, and the control circuit outputs N phase staggered pulse width modulated control signals with a phase staggering of 360°/N, the high speed field effect transistors having a voltage rating below $V_{rated}$ and exceeding $V_{rated}/N$ where $V_{rated}$ is a maximum voltage amplitude delivered to the gradient coil.

8. The power supply as set forth in claim 4, wherein there are four switching power regulators, and the control circuit outputs four phase staggered pulse width modulated control signals with a phase staggering of 90°.

9. The power supply as set forth in claim 4, wherein the phase staggered pulse width modulated control signals each have a same duty cycle.

10. The power supply as set forth in claim 4, further including:
    a bipolar circuit receiving power from the series connected switching power regulators and delivering the power at a selected polarity to the gradient coil.

11. The power supply as set forth in claim 10, wherein the control circuit includes:
    a timing circuit that outputs phase staggered carrier signals;
    a pulse width circuit that outputs a pulse width parameter; and
    a pulse width modulator that outputs the pulse width modulated control signals with phases based on the phase staggered carrier signals and pulse widths corresponding to the pulse width parameter.

12. The power supply as set forth in claim 11, wherein the pulse width modulator includes:
    a plurality of pulse width modulators each receiving one of the phase staggered carrier signals and outputting one of the pulse width modulated control signals.

13. The power supply as set forth in claim 11, wherein the pulse width circuit computes the pulse width parameter based on a measured operating parameter of the gradient coil.

14. The power supply as set forth in claim 10, wherein the bipolar circuit includes:
a full bridge circuit.

15. The power supply as set forth in claim 10, wherein the bipolar circuit includes insulated gate bipolar transistors.

16. The power supply as set forth in claim 10, wherein the bipolar circuit includes:
transistors having a frequency rating substantially below a frequency of the pulse width modulated control signals.

17. A method for applying controlled power to a magnetic field gradient coil of a magnetic resonance imaging apparatus, the method including:
generating phase staggered pulse width modulated control signals from a single pulse width modulated control signal, the phase staggered pulse width modulated control signals all having the same pulse width;
producing a plurality of switched power outputs each of which is switched by one of the phase staggered pulse width modulated control signals applied to a field effect transistor;
combining the switched power outputs in series;
applying the series combined switched power outputs to the gradient coil;
measuring the current through the ma magnetic field gradient coil; and
feedback controlling the single pulse width modulated control signal based on the measured current through the magnetic field gradient coil.

18. The method as set forth in claim 17, wherein the generating of phase staggered pulse width modulated control signals includes:
phase shifting a carrier signal by a selected phase shift;
triggering an electrical pulse having a selected pulse width based on the carrier signal; and
repeating the phase shifting and triggering for each of a plurality of phase shifts.

19. The method as set forth in claim 18, wherein each of the plurality of phase shifts is an integer multiple of a fundamental phase shift.

20. The method as set forth in claim 19, wherein the fundament phase shift is 360°/N where N is a total number of phase staggered pulse width modulated control signals.

21. The method as set forth in claim 17, further including:
selecting a duty cycle for the phase staggered pulse width modulated control signals based on a desired magnetic field gradient.

22. The method as set forth in claim 17, wherein the applying of the series combined switched power outputs to the gradient coil includes:
applying the series combined switched power outputs to the gradient coil at a selected polarity.

* * * * *